United States Patent [19]

Lyons et al.

[11] Patent Number: 5,273,856
[45] Date of Patent: Dec. 28, 1993

[54] POSITIVE WORKING PHOTORESIST COMPOSITION CONTAINING MID OR NEAR UV RADIATION SENSITIVE QUINONE DIAZIDE AND SULFONIC ACID ESTER OF IMIDE OR OXIME WHICH DOES NOT ABSORB MID OR NEAR UV RADIATION

[75] Inventors: Christopher F. Lyons, LaGrangeville; Stanley E. Perreault; Gary T. Spinillo, both of Wappingers Falls; Robert L. Wood, Poughkeepsie, all of N.Y.

[73] Assignee: International Business Machines Corporation, Armonk, N.Y.

[21] Appl. No.: 606,652

[22] Filed: Oct. 31, 1990

[51] Int. Cl.$^5$ .................... G03F 7/023; G03C 1/61
[52] U.S. Cl. .................... 430/191; 430/165; 430/192; 430/193
[58] Field of Search ............... 430/191, 270, 165, 192, 430/193

[56] References Cited

U.S. PATENT DOCUMENTS

| | | |
|---|---|---|
| 2,767,092 | 10/1956 | Schmidt . |
| 3,050,389 | 8/1962 | Sus . |
| 3,061,430 | 10/1962 | Uhlig et al. . |
| 3,640,992 | 2/1972 | Sus et al. . |
| 4,371,605 | 2/1983 | Renner .................... 430/280 |
| 4,397,937 | 8/1983 | Clecak et al. ............ 430/192 |
| 4,411,978 | 10/1983 | Laridon et al. .......... 430/191 |
| 4,618,564 | 10/1986 | Demmer et al. ........ 430/326 |

*Primary Examiner*—Charles L. Bowers, Jr.
*Assistant Examiner*—Christopher G. Young
*Attorney, Agent, or Firm*—John A. Stemwedel; Dale M. Crockatt

[57] ABSTRACT

Positive photoresist compositions which comprise an alkali soluble resin material, a diazoquinone dissolution inhibitor which decompose on exposure to mid and near UV radiation, and a sulfonic acid ester of an imide or oxime which does not absorb such mid or near UV radiation. Resist images of high contrast are formed.

16 Claims, No Drawings

POSITIVE WORKING PHOTORESIST COMPOSITION CONTAINING MID OR NEAR UV RADIATION SENSITIVE QUINONE DIAZIDE AND SULFONIC ACID ESTER OF IMIDE OR OXIME WHICH DOES NOT ABSORB MID OR NEAR UV RADIATION

FIELD OF THE INVENTION

The invention relates to non-amplified alkali developable, photoresist compositions, more particularly, the present invention is concerned with positive photoresist compositions which demonstrate improved contrast, especially when exposed in the mid and near UV spectra.

BACKGROUND ART

The use of alkali developable non-amplified photoresists in the fabrication of microelectronic devices is well-known. Wet-developable systems have undergone many improvements in order to get a higher degree of integration on the semiconductor substrate.

These developments have included modification to the sensitizer which, in the case of the "conventional" diazoquinone-novolak system, serves as a dissolution inhibitor to permit certain regions (i.e., the exposed areas) of the patterned resist layer to be dissolved while maintaining the remaining region (i.e., unexposed areas) as an insoluble layer.

The light sensitive diazoquinone sensitizers have been modified to achieve sensitivity to different wavelengths. Such materials are generally described in U.S. Pat. Nos. 2,767,092, 3,050,389, 3,061,430 and 3,640,992. These materials are admixed with alkali-soluble resins or fatty acids to inhibit alkali solubility. Upon light-induced chemical reaction, the solubility of such film compositions is altered in the exposed regions to permit the formation of patterns with an aqueous developer.

Much activity has gone into developing improved sensitizers and compositions which incorporate such sensitizers. U.S. Pat. No. 4,397,937 is directed to sensitizers of improved sensitivity and solubility in novolak resins permitting higher sensitizer loading. Such compositions show increased sensitivity in the mid UV optical spectrum and to electron beam exposure.

A problem noted in optical exposure has been the fall off in contrast or line definition between areas of exposure and non-exposure. At the boundaries of such patterning there have been found regions where there is light (weak) exposure causing a gradient in the development that prevents the formation of sharp side-walled images.

U.S. Pat. No. 4,618,564 is directed to compositions comprising a film forming organic material consisting essentially of an aqueous base soluble material and a substance which releases sulfonic acid upon exposure to active radiation to make the exposed regions of the film more soluble to aqueous base developers. The sulfonic acid releasing materials include sulfonate esters and aromatic N-sulfonyloxyimides. These materials can be flood exposed after patterning and substrate processing to make the remaining patterned layer soluble in aqueous base developer.

Patent application, U.S. Ser. No. 322,848, filed Mar. 14, 1989, the disclosure of which is incorporated by reference into the present application, discloses chemically amplified photoresist compositions having a polymeric or molecular composition whose solubility is dependent upon the presence of acid removable protecting groups and a sulfonic acid precursor which generates a strong acid upon exposure to radiation. The preferred sulfonic acid generators are sulfonyloxymides of the form

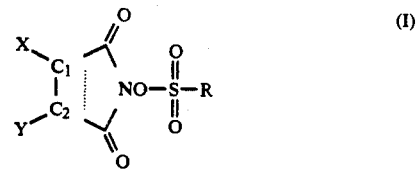
(I)

where $C_1$ and $C_2$ may form a single or double bond wherein R is selected from $-(CH_2)_n-Z$ and $-(CF_2)_n-Z$ where $n=0$ to 4, where Z is H,F, alkylaryl

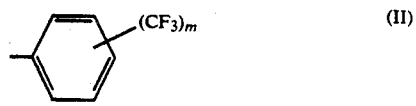
(II)

or

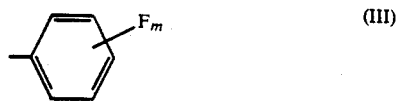
(III)

where m is from 1 to 5, provided that when Z is H,F or alkylaryl n must be at least 1, and where X and Y (1) form a cyclic or polycyclic ring which may contain one or more hetero atoms, (2) form a fused aromatic ring, (3) may be independently H, alkyl or aryl, (4) may be attached to another sulfonyloxyimide containing residue, or (5) may be attached to a polymeric chain or backbone.

A preferred sensitizer described for use in deep UV chemically amplified resist systems is trifluoromethylsulfonyloxybicyclo[2.2.1]-hept-5-ene-2,3-dicarboximide (MDT) and having the structure

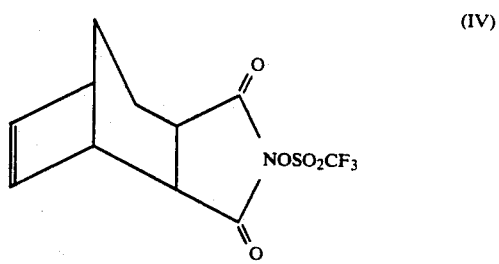
(IV)

SUMMARY OF THE INVENTION

In accordance with the present invention, positive photoresist compositions are provided which comprise an alkali soluble resin material, a diazoquinone dissolution inhibitor which decomposes on exposure to mid or near UV radiation, and a sulfonic acid ester of an imide or oxime which does not absorb such mid or near UV radiation.

The compositions of the invention provide photoresists of improved contrast enabling the use of stronger developers while maintaining straight image walls.

BRIEF DESCRIPTION OF THE PREFERRED EMBODIMENTS

The compositions of the present invention are non-amplified positive working photoresist system. The compositions comprise several components, the function of each of which will become apparent to those skilled in the art in light of the disclosure and claims provided hereby.

The resin matrix for the composition is an alkali soluble resin. Such resin may be phenol-formaldehyde condensation product (a novolak). Cresol-formaldehyde is a preferred novolak resin. Other novolak resins may be used as well.

The dissolution inhibitor will preferably be a diazoquinone sulfonic acid ester of the kinds well known in the art. The materials include o-diazoquinone compositions. Especially preferred are the o-naphthaquinonediazides. Such materials have been long formulated with novolak resins for use in optical lithography. We find that a preferred sensitizer is the 4,8-bis(6-diazo-5,6)-dihydro-5-oxo-1-naphthalene-sulfonyloxy-1'-yl)tricyclo-[5.2.1.0$^{2,6}$] decane (hereinafter bis DQTD) which is disclosed in U.S. Pat. No. 4,397,937.

The dissolution inhibitor is present in an amount based on solids of from about 10 to 25 weight percent, preferably from about 15 to 20 weight per cent.

The sulfonic acid ester of an imide or oxime is selected specifically for the fact that it does not react or degrade under the radiation which causes the dissolution inhibitor to change polarity, and additionally is highly resistant to alkaline developers. The preferred sulfonyloxyimide is MDT as described above.

The sulfonic acid ester of an imide or oxime is present in an amount based on solids from about 1 to 20 weight percent, preferably from 5 to 10 weight percent.

The photoresist compositions of the present invention are formulated with an appropriate organic solvent. Typically the solvent will be propyleneglycol monomethyl ether acetate (PM acetate), ethyl lactate, or ethoxy ethyl proprionate (EEP). Solvent mixtures may be used as well. Other suitable solvents are known in the art and may be used. The compositions will have from about 10 to 40 weight percent solids. The most preferred compositions have 15 to 25 weight percent solids.

EXAMPLE 1

A photoresist composition was prepared as follows:

|  | % by weight of solids |
| --- | --- |
| Cresol-formaldehyde resin | 73 |
| Bis DQTD | 17 |
| MDT | 10 | in propylene glycol monomethyl ether acetate such that the total solids content was about 22 weight percent of the composition.

EXAMPLE 2

The photoresist of Example 1 was compared to a control photoresist prepared without MDT. Films were spin-coated on silicon wafers and baked on a 90° C. hotplate for 5 minutes. Wafers were exposed using a mid-UV mercury lamp exposure source at 126 mJ through a mask having a multi-density step-wedge pattern. Following exposure, the wafers were baked on a 90° C. hotplate for one minute, then developed in 0.21N aqueous tetramethylammonium hydroxide (TMAH) for 4 minutes. Measurement of remaining thickness in the multi-density step wedge patterned area was used to determine resist sensitivity and contrast. These measurements showed that both resists had a sensitivity of 77 mJ, but the sample containing MDT gave a contrast (gamma value) of 4.8, while the control showed a gamma value of only 1.6. This result shows that MDT addition improved resist contrast without imposing a higher dose requirement.

EXAMPLE 3

The composition of Example 1 was coated onto 82 mm silicon wafers. The coated wafers were baked for 30 minutes at 95° C. to drive off solvent. The wafers were patternwise exposed in a 436 nm (g-line) projection step-and-repeat camera, and showed high contrast 0.7 μm lines and spaces after development in tetramethylammonium hydroxide TMAH (0.21N solution).

EXAMPLE 4

Additional wafers were coated with the resist compositions of Example 1. The coated wafers were baked at 90° C. for 1 min and were exposed with an i-line tool at 365 nm. The wafers were then baked at 95° C. for 300 seconds. The exposed wafers were developed with 0.21N TMAH and 0.6 μm lines and spaces were resolved.

EXAMPLE 5

A photoresist was formulated by adding 18% by weight bis DQTD to a novolak resin obtained from the condensation of m-cresol and formaldehyde. Another formulation was prepared similarly except for the addition of 12 weight % MDT. Films were cast on Si substrates using propylene glycol methyl ether acetate (PM acetate) as a coating solvent and patternwise exposed with 365 nm radiation on a 5× reduction aligner. The wafers were post exposure baked on a hotplate at 95° C. for 60 seconds and developed in a 0.24N aqueous solution of TMAH. The sample without the MDT additive gave poor reproduction of the mask with significant roughening of the line edges and rounded profiles and loss of thickness. The sample containing the MDT additive showed excellent mask reproduction with sharply defined lines, vertical profiles and no thickness loss. The developer resistance of the films was compared by laser interferometer measurement of their unexposed dissolution rates. The formulation without the MDT additive dissolved at a rate of 1500 angstroms per minute. The formulation with MDT dissolved at 20 angstroms per minute.

EXAMPLE 6

A photoresist was formulated by combining 14% by weight bis DQTD, 9% by weight MDT, and 77% by weight of mixed cresol-formaldehyde novolak resin in propylene glycol methyl ether acetate at 20% solids. A second sample was prepared identically except the MDT was omitted. The resulting resist formulations were coated on silicon wafers to give 2.7 μm coating thickness, baked on a 90° C. hotplate for 2 minutes, and pattern-wise exposed at 50 mJ on an h-line (405 nm) projection aligner. Wafers were then baked at 90° C. on a hotplate for one minute and developed for 4 minutes in 0.17N aqueous potassium hydroxide (KOH) developer. The resulting images showed superior resolution and sidewall profile in the resist containing MDT.

Without MDT, resolution was limited to 1.1 μm line/space pairs, and image sidewalls were not vertical. With MDT, 0.7 μm line/space pairs were clearly resolved and showed vertical sidewalls.

EXAMPLE 7

The resist formulations of Example 6 were coated on silicon wafers to give 1.7 μm film thickness. Using the bake process of Example 5, wafers were pattern-wise exposed on a g-line (436 nm) projection aligner, and developed in 0.12N aqueous KOH for 6 minutes. The resist formulation containing MDT showed clearly resolved 0.7 μm line/space features with vertical sidewalls. The formulation without MDT failed to resolve features below 1 μm size.

EXAMPLE 8

A resist was formulated by combining 75 weight percent meta-cresol formaldehyde novolak resin, 17 weight percent bis DQTD, and 8 weight percent 1,2,3,4,5-pentafluorophenylsulfonyloxybicyclo[2,2,1]-hept-5-ene-2,3-dicarboximide (MDF) in propylene glycol methyl ether acetate at approximately 20% solids. This resist was spin coated on a silicon wafer to give a film thickness of about one micron. After baking on a 90° C. hotplate for one minute, the wafer was exposed as in Example 2 and baked again at 90° C. for one minute. The wafer was developed in 0.21N aqueous TMAH for four minutes. The resulting step-wedge pattern indicated a resist gamma of 5.0, demonstrating substantial improvement in contrast due to the presence of MDF in the resist formulation.

EXAMPLE 9

A photoresist was formulated by adding 17.8 weight percent bis DQTD and 7.1 weight percent MDT to poly(3-methyl-4-hydroxystyrene). The components were dissolved in propylene glycol methyl ether acetate at a total solids content of 25 weight percent. A coating was applied to a Si substrate and baked at 95° C. for one minute. The sample was patternwise exposed to 365 nm radiation on a 5× reduction aligner. After post exposure baking and development in 0.20N aqueous TMAH excellent reproduction of the mask was obtained to 0.6 micron dimensions.

EXAMPLE 10

Similar results will be achieved when compositions having 75 weight percent meta-cresol formaldehyde novolak resin, 17 weight percent bis-DQTD and 8 weight percent trifluoromethylphenylsulfonyloxybicyclo[2.2.1]-hept-5-ene-2,3-dicarboximide in PM acetate. The composition may be developed in aqueous TMAH to produce images of high contrast.

While only the preferred embodiments of the present invention are described above, many potential modifications which fall within the generic concept will occur to those skilled in the art upon a reading of the present disclosure. Such modifications in terms of resin matrices, dissolution inhibitors, and sulfonic acid ester of an imide or oxime, as well as in the solvents for the resist compositions as here set forth are within the teaching of the present invention and within its scope as set forth in the claims which follow.

What is claimed is:

1. A positive acting photoresist composition comprising, in admixture:

a functional amount of an alkali soluble resin, a functional amount of a diazoquinone dissolution inhibitor which decomposes on exposure to mid or near UV radiation, and a functional amount of a sulfonic acid ester of an imide or oxime which does not absorb said mid or near UV radiation.

2. The composition of claim 1 wherein the diazoquinone dissolution inhibitor comprises 10-25 weight percent of the solids of the composition.

3. The photoresist composition of claim 1 wherein the sulfonic acid ester comprises 1 to 20 weight percent of the solids of the composition.

4. The composition of claim 1 wherein the dissolution inhibitor comprises 15-20 weight percent of the solids of the composition.

5. The photoresist composition of claim 3 wherein the sulfonic acid ester comprises 5-10 weight percent of the solids of the composition.

6. The photoresist composition of claim 1 which also includes an organic solvent.

7. The photoresist composition of claim 6 which comprises 10-40 weight percent solids.

8. The photoresist composition of claim 7 which comprises 15-25 weight percent solids.

9. The photoresist composition of claim 6 wherein the solvent is selected from the group consisting of propylene glycol monomethyl ether acetate, ethyl lactate, and ethoxy ethyl proprionate.

10. The photoresist composition of claim 1 wherein the alkali soluble resin has hydroxy phenyl groups.

11. The photoresist composition of claim 10 wherein the alkali soluble resin is selected from the group consisting of phenolic resins, hydroxystyrene resins, and combinations and copolymers thereof.

12. The photoresist composition of claim 11 wherein the alkali soluble resin is selected from cresylic acid resins and poly(3-methyl-4-hydroxystyrene).

13. The photoresist composition of claim 1 wherein the diazoquinone dissolution inhibitor is an o-diazoquinone composition.

14. The photoresist composition of claim 13 wherein the o-diazoquinone is an o-napthoquinonediazide.

15. The photoresist composition of claim 1 wherein the sulfonic acid ester with an imide or oxime is of the form

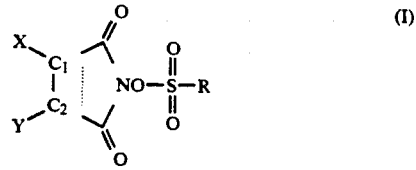

where $C_1$ and $C_2$ may form a single or double bond wherein R is selected from $-(CH_2)_n-Z$, and $-(CF_2)_n-Z$ where $n=0$ to 4, where Z is H,F, alkylaryl,

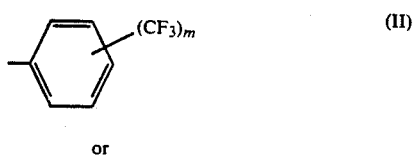

or

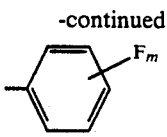
(III)

where m is from 1 to 5, provided that when Z is H, F, or alkylaryl, n must be at least 1, and where X and Y (1) form a cyclic or polycyclic ring which may contain one or more hetero atoms, (2) form a fused aromatic ring, (3) may be independently H, alkyl or aryl, (4) may be attached to another sulfonyloxyimide containing residue, or (5) may be attached to a polymeric chain or backbone.

16. The photoresist composition of claim 15 wherein the sulfonic acid ester with an imide or oxime is selected from the group consisting of trifluoromethysulfonyloxybicyclo[2.2.1]-hept-5-ene-2,3-dicarboximide and 1,2,3,4, 5-pentafluorophenylsulfonyloxybicyclo[2.2.1.]-hept-5-ene-2,3-dicarboximide.

* * * * *